(12) United States Patent
Egashira

(10) Patent No.: US 11,999,820 B2
(45) Date of Patent: Jun. 4, 2024

(54) LIQUID CRYSTAL POLYMER PARTICLES, THERMOSETTING RESIN COMPOSITION, AND MOLDED ARTICLE

(71) Applicant: ENEOS Corporation, Tokyo (JP)

(72) Inventor: Toshiaki Egashira, Tokyo (JP)

(73) Assignee: ENEOS Corporation, Tokyo (JP)

( * ) Notice: Subject to any disclaimer, the term of this patent is extended or adjusted under 35 U.S.C. 154(b) by 116 days.

(21) Appl. No.: 17/637,195

(22) PCT Filed: Aug. 7, 2020

(86) PCT No.: PCT/JP2020/030334
§ 371 (c)(1),
(2) Date: Feb. 22, 2022

(87) PCT Pub. No.: WO2021/033578
PCT Pub. Date: Feb. 25, 2021

(65) Prior Publication Data
US 2022/0282034 A1   Sep. 8, 2022

(30) Foreign Application Priority Data
Aug. 22, 2019 (JP) ................................. 2019-152182

(51) Int. Cl.
*C08G 63/60* (2006.01)
*C09K 19/38* (2006.01)
*C09K 19/54* (2006.01)

(52) U.S. Cl.
CPC .......... *C08G 63/60* (2013.01); *C09K 19/3809* (2013.01); *C09K 19/544* (2013.01); *C09K 2019/546* (2013.01)

(58) Field of Classification Search
CPC .. C08G 63/60; C08G 73/1071; C08G 63/605; C08J 3/12; C08J 3/212; C08J 2467/03; C08J 2300/12; C08J 2367/03; C08J 2379/08; H05K 1/0373; H05K 3/0014; H05K 2201/0212; H05K 2201/0141; H05K 1/0393; H05K 2201/09118; C08L 79/08; C08L 67/03; C08L 61/04; C09K 19/3809; C09K 19/544; C09K 2019/546; C09D 179/08
See application file for complete search history.

(56) References Cited

U.S. PATENT DOCUMENTS

| | | | |
|---|---|---|---|
| 6,207,240 B1 | 3/2001 | Schoenfeld et al. | |
| 2007/0144399 A1* | 6/2007 | Nagashima | .......... C09D 11/322 106/31.6 |
| 2011/0240353 A1 | 10/2011 | Kohinata et al. | |
| 2014/0087086 A1 | 3/2014 | Nair et al. | |
| 2014/0231123 A1* | 8/2014 | Onodera | ..................... C08J 5/18 174/255 |
| 2017/0130009 A1 | 5/2017 | Hosoda et al. | |
| 2017/0306562 A1* | 10/2017 | Phipps | ..................... D01F 1/10 |
| 2019/0241711 A1 | 8/2019 | Komatsu | |

FOREIGN PATENT DOCUMENTS

| | | | | | |
|---|---|---|---|---|---|
| CN | 101240106 A | * | 8/2008 | ............. | C08L 67/00 |
| CN | 102206352 A | | 10/2011 | | |
| CN | 104508017 A | | 4/2015 | | |
| CN | 108884325 A | | 11/2018 | | |
| EP | 3604347 A1 | | 2/2020 | | |
| JP | H05125258 A | * | 5/1993 | | |
| JP | 2000-080180 A | | 3/2000 | | |
| JP | 2003121690 A | * | 4/2003 | | |
| JP | 2005146124 A | * | 6/2005 | | |
| JP | 2010-077397 A | | 4/2010 | | |
| JP | 2011-213802 A | | 10/2011 | | |
| JP | 2015-530460 A | | 10/2015 | | |
| JP | 2018-172572 A | | 11/2018 | | |
| JP | 2020055241 A | * | 4/2020 | | |
| JP | 2020-084185 A | | 6/2020 | | |
| TW | 201803938 A | * | 2/2018 | ............. | C08L 101/00 |
| WO | WO 2013/137488 A1 | | 9/2013 | | |
| WO | WO 2017/150336 A1 | | 9/2017 | | |
| WO | WO 2018/021389 A1 | | 2/2018 | | |
| WO | WO 2019/240013 A1 | | 12/2019 | | |

OTHER PUBLICATIONS

Japanese Patent Office, International Search Report in International Patent Application No. PCT/JP2020/030334 (dated Oct. 6, 2020).
The International Bureau of WIPO, International Preliminary Report on Patentability in International Patent Application No. PCT/JP2020/030334 (dated Feb. 17, 2022).
China National Intellectual Property Administration, Office Action in Chinese Patent Application No. 202080044773.3 (dated Mar. 23, 2023).
European Patent Office, Extended European Search Report in European Patent Application No. 20854587.1 (dated Aug. 14, 2023).
Japan Patent Office, Office Action in Japanese Patent Application No. 2021-540729 (dated Nov. 14, 2023).

* cited by examiner

*Primary Examiner* — Hoan C Nguyen
(74) *Attorney, Agent, or Firm* — Leydig, Voit & Mayer, Ltd.

(57) ABSTRACT

Disclosed are liquid crystal polymer particles capable of reducing dielectric loss tangent while suppressing surface roughness of the resin film, when added to a resin film. The liquid crystal polymer particles have a melting point of 270° C. or higher, wherein cumulative distribution 50% diametre $D_{50}$ in the particle size distribution is 20 μm or less, and cumulative distribution 90% diametre $D_{90}$ is 2.5 times or less of $D_{50}$.

20 Claims, No Drawings

LIQUID CRYSTAL POLYMER PARTICLES, THERMOSETTING RESIN COMPOSITION, AND MOLDED ARTICLE

BACKGROUND OF THE INVENTION

Field of the Invention

The present invention relates to liquid crystal polymer particles. The present invention present invention relates to a thermosetting resin composition containing the liquid crystal polymer particles and a molded article using the thermosetting resin composition.

Background Art

Signals having a frequency in the high frequency band have been used more in electronic instruments, communication instruments, etc. in recent years, along with the increase in the amount of information communication in the communication field, and particularly, active use is made in signals having a frequency in the gigahertz (GHz) band having a frequency of $10^9$ Hz or more. However, as the frequencies of signals used get higher, the quality of output signals decreases, which may lead to recognizing information erroneously, i.e., transmission loss increases. This transmission loss is consisted of a conductor loss caused by the conductor and a dielectric loss caused by a resin composition for insulation which forms the electric/electronic component such as electronic circuit boards in electronic and communication instruments, and as the conductor loss is proportional to $0.5^{th}$ power of the frequency to be used and the dielectric loss is proportional to $1^{st}$ power of the frequency, the effect of this dielectric loss becomes extremely large in the high frequency band, in particular, in the GHz band. Under such circumstances, a resin having excellent dielectric properties has been studied as a resin used for a circuit board. For example, a polyimide film has low dielectric constant and its use has been studied, but there is room for improvement in terms of lowering the dielectric loss tangent.

Liquid crystal polymers have excellent dimensional stability, heat resistance, chemical stability, low dielectric constant, and low water absorption rate, etc. and thus their application has been studied as resin compositions for insulation constituting electrical and electronic components such as electronic circuit boards. However, since liquid crystal polymers generally have low melt tension and poor productivity in film molding, films made of liquid crystal polymers have the problem of being expensive. Therefore, for example, Patent Document 1 discloses the production of a molded article using a specific thermosetting resin composition containing a liquid crystal polymer having a repeating unit and a thermosetting resin.

Since liquid crystal polymers have excellent dielectric properties, thin films tend to be desired in recent years for the purpose of improving substrate materials for circuits for processing high-frequency signals. In the production of thin film films using liquid crystal polymers, liquid crystal polymer particles having small particle sizes are required. In order to obtain liquid crystal polymer particles having smaller particle sizes, for example, Patent Document 2 discloses conducting pulverization in a "prepolymer" stage, and after the pulverization, conducting solid-phase polymerization (heat treatment in a powder state) to form a powder. In addition, Patent Document 3 discloses that grinding properties are improved by the composition of aromatic polyester.

PRIOR ART DOCUMENT

Patent Document

Patent Document 1: WO2017/150336
Patent Document 2: JP2010-77397
Patent Document 3: JP2015-530460

SUMMARY OF THE INVENTION

Problems to be Solved by the Invention

However, although in the Examples of Patent Document 1 a molded article having a thickness of 2 mm is produced using a liquid crystal polymer particle-containing resin composition, the surface roughness has not been sufficiently studied when a molded article having a thin film (for example, 200 µm or less) is produced. In fact, the LCP particles 2 and 3 described in the Examples of Patent Document 1 have peak particle sizes exceeding 200 µm, and it is presumed that a thin film having a thickness of 200 µm or less affects the surface roughness of the molded article.

Further, in Patent Document 2, it is not preferable to conduct pulverizing in a state where acetic acid, an unreacted monomer, or the like remain since they adversely affect the durability of the grinding machine, and as a result, the cost tends to increase. Further, in Patent Document 3, the addition of dihydroxydiphenylsulfone or the like is essential, and when such a polar group is included in the main chain, the dielectric constant and dielectric loss tangent tend to increase.

Accordingly, it is an object of the present invention to provide liquid crystal polymer particles which, when added to a resin film, can reduce the dielectric loss tangent while suppressing the surface roughness of the resin film. It is also an object of the present invention to provide a thermosetting resin composition containing such liquid crystal polymer particles and a molded article obtained by using the thermosetting resin composition.

Means for Solving the Problem

As a result of intensive studies to achieve the above object, the present inventors have found that the above problems can be solved by adjusting the values of cumulative distribution 50% diametre $D_{50}$ and cumulative distribution 90% diametre D90, which are parameters in the particle size distribution of liquid crystal polymer particles, within specific ranges, thereby completing the present invention. The present invention has been completed on the basis of such findings.

That is, according to one embodiment of the present invention, there is provided
liquid crystal polymer particles having a melting point of 270° C. or higher, wherein cumulative distribution 50% diametre $D_{50}$ in the particle size distribution is 20 µm or less, and cumulative distribution 90% diametre $D_{90}$ is 2.5 times or less of $D_{50}$.

In one embodiment of the present invention, it is preferable that dielectric loss tangent of the liquid crystal polymer particles is 0.001 or less.

In one embodiment of the present invention, it is preferable that the ratio of modal diametre $D_p$ to $D_{50}$ in the particle size distribution of the liquid crystal polymer particles is 0.7 or more and 1.3 or less.

In one embodiment of the present invention, it is preferable that the liquid crystal polymer particles have a water absorption rate of 0.05% or less.

In one embodiment of the present invention, it is preferable that the liquid crystal polymer particles comprise structural unit (I) derived from a hydroxycarboxylic acid, structural unit (II) derived from a diol compound, and structural unit (III) derived from a dicarboxylic acid.

In one embodiment of the present invention, the structural unit (I) derived from a hydroxycarboxylic acid is preferably a structural unit derived from 6-hydroxy-2-naphthoic acid.

In one embodiment of the present invention, the composition ratio of the structural unit (I) is preferably 40 mol % or more and 80 mol % or less with respect to the structural units of the entire liquid crystal polymer particles.

In another embodiment of the present invention, there is provided a thermosetting resin composition comprising the liquid crystal polymer particles and a thermosetting resin.

In another embodiment of the present invention, the content of the liquid crystal polymer particles is preferably 5 to 80% by mass with respect to the total solid content mass of the thermosetting resin composition.

In another embodiment of the present invention, it is preferable that the thermosetting resin is at least one selected from the group consisting of an epoxy resin, phenol resin, polyimide resin, and bismaleimide triazine resin.

According to another embodiment of the present invention, there is provided a method for producing the thermosetting resin composition comprising the step of mixing at least the liquid crystal polymer particles and the thermosetting resin at a temperature lower than the melting point of the liquid crystal polymer particles.

According to another embodiment of the present invention, there is provided a molded article using the thermosetting resin composition.

In another embodiment of the present invention, the molded article is preferably in the form of a film, a sheet or a plate.

In another embodiment of the present invention, the molded article is preferably a resin film having a thickness of 25 μm or less.

According to another embodiment of the present invention, surface roughness Ra of the resin film of the molded article is preferably 1.0 μm or less.

According to another embodiment of the present invention, there is provided an electronic circuit board comprising the thermosetting resin composition or comprising the molded article.

In another embodiment of the present invention, the electronic circuit board is preferably a flexible circuit board.

Effect of the Invention

When the liquid crystal polymer particles of the present invention are added to a resin film, the dielectric loss tangent can be reduced while suppressing the surface roughness of the resin film. Further, the present invention can provide a thermosetting resin composition comprising such liquid crystal polymer particles and a molded article obtained by using the thermosetting resin composition.

MODE FOR CARRYING OUT THE INVENTION

Liquid Crystal Polymer Particles

The liquid crystal polymer particles of the present invention are fine particles having a specific particle size distribution, which are obtained using a liquid crystal polymer as a raw material. In the present invention, the particle size distribution of the liquid crystal polymer particles can be measured by using a laser diffraction/scattering method particle size distribution measuring device. The cumulative distribution 50% diametre $D_{50}$ (hereinafter referred to as "$D_{50}$") in the particle size distribution represents the value of the particle size at which the cumulative distribution from the small particle diametre side becomes 50%, the cumulative distribution 90% diametre $D_{90}$ (hereinafter referred to as "$D_{90}$") represents the value of the particle size at which the cumulative distribution from the small particle diametre side becomes 90%, and the modal diametre $D_p$ (hereinafter referred to as "$D_p$") represents the value of the particle size at the highest frequency.

The liquid crystal polymer particles are characterized in that $D_{50}$ in the particle size distribution is 20 μm or less, and $D_{90}$ is 2.5 times or less of $D_{50}$.

The $D_{50}$ is preferably 0.1 μm or more, more preferably 1 μm or more, further preferably 3 μm or more, more preferably 5 μm or more, and preferably 15 μm or less, more preferably 12 μm or less, further preferably 10 μm or less, further more preferably 6 μm or less.

$D_{90}$ is preferably 2.2 times or less, more preferably 2.0 times or less, and further preferably 1.8 times or less of $D_{50}$.

By adjusting the values of $D_{50}$ and $D_{90}$, which are parameters in the particle size distribution of the liquid crystal polymer particles, within the above ranges, it is possible to reduce the dielectric loss tangent while suppressing the surface roughness of the resin film when added to the resin film. It is to be noted that the values of $D_{50}$ and $D_{90}$ can be adjusted depending on the method of pulverizing the liquid crystal polymer particles, condition of a sieve after pulverization, and the like.

In the liquid crystal polymer particles of the present invention, the ratio of $D_p$ to $D_{50}$ in the particle size distribution is preferably 0.7 or more and 1.3 or less, more preferably 0.75 or more and 1.25 or less, and more preferably 0.8 or more and 1.2 or less. When addition to the resin film is conducted, it is possible to reduce the dielectric loss tangent while suppressing the surface roughness of the resin film by adjusting the ratio of $D_p$ to $D_{50}$ within the above ranges. The value of $D_p$ can be adjusted by the method of pulverizing the liquid crystal polymer particles, condition of a sieve after the pulverization, or the like, in the same manner as the values of $D_{50}$ and $D_{90}$.

Liquid crystallinity of a liquid crystal polymer can be confirmed by observing the presence or absence of optical anisotropy after heating and melting the liquid crystal polymer on a microscope heating stage, using a polarizing microscope (product name: BH-2) manufactured by Olympus Co., Ltd. equipped with a microscope hot stage (product name: FP82HT) manufactured by Mettler.

Melting point of the liquid crystal polymer particles is 270° C. or higher, and the lower limit is preferably 280° C. or higher, more preferably 290° C. or higher, further preferably 300° C. or higher, and the upper limit is preferably 370° C. or lower, more preferably 360° C. or lower, further preferably 350° C. or lower. By setting the melting point of the liquid crystal polymer within the above-mentioned numerical ranges, it is possible to improve the heat resistance of the resin film obtained by adding the liquid crystal polymer particles of the present invention. In the present specification, the melting point of the liquid crystal polymer is in accordance with the test method of ISO11357 and ASTM D3418, and can be measured using a differential scanning calorimeter (DSC) manufactured by Hitachi High-Tech Science Co., Ltd.

Dielectric loss tangent (measurement frequency: 10 GHz) of the liquid crystal polymer particles is 0.001 or less, preferably 0.0009 or less, more preferably 0.0008 or less, and further preferably 0.0007 or less. This value is a measurement of the dielectric loss tangent of the liquid crystal polymer particles in the in-plane direction of the injection molded article. The injection molded article is a flat test piece having a thickness of 30 mm×30 mm×0.4 mm.

Water absorption rate of the liquid crystal polymer particles is preferably 0.05% or less, more preferably 0.04% or less, and further preferably 0.03% or less. The water absorption rate was determined by measuring the weight of the test piece in a dry state and the weight at the time of water absorption after the test piece was immersed in water for 24 hours, and dividing the difference between the weight at the time of water absorption and the weight at the time of drying by the weight at the time of drying. Since the liquid crystal polymer particles have the above-mentioned low water absorption rate, it is possible to stably exhibit low dielectric performance even under actual use.

The composition of the liquid crystal polymer used as the raw material for the liquid crystal polymer particles according to the present invention is not particularly limited, and it is preferable that the liquid crystal polymer contains structural unit (I) derived from an aromatic hydroxycarboxylic acid, structural unit (II) derived from an aromatic diol compound, and structural unit (III) derived from an aromatic dicarboxylic acid. Furthermore, the liquid crystal polymer according to the present invention may further contain structural unit (IV) as a structural unit other than the structural units (I) to (III). Hereinafter, each structural unit contained in the liquid crystal polymer will be described.

Structural Unit (I) Derived from Hydroxycarboxylic Acid

Structural unit (I) constituting the liquid crystal polymer is a structural unit derived from a hydroxycarboxylic acid, and is preferably a structural unit derived from an aromatic hydroxycarboxylic acid represented by formula (I). It should be noted that only one of the structural unit (I) may be contained or even two or more may be contained.

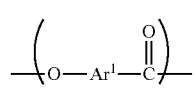

In the above formula, $Ar^1$ is selected from the group consisting of a phenyl group optionally having a substituent, biphenyl group, 4,4'-isopropylidenediphenyl group, naphthyl group, anthryl group and phenanthryl group. Among these groups, naphthyl group is preferable. Examples of the substituent include hydrogen, alkyl group, alkoxy group, fluorine, and the like. The alkyl group preferably has 1 to 10 carbon atoms, more preferably 1 to 5 carbon atoms. The alkyl group may be a linear alkyl group or a branched alkyl group. The number of carbon atoms in the alkoxy group is preferably 1 to 10, more preferably 1 to 5.

Examples of the monomer that gives the structural unit represented by formula (I) include 6-hydroxy-2-naphthoic acid (HNA; formula (1) below), acylated products thereof, ester derivatives thereof, acid halides thereof, and the like.

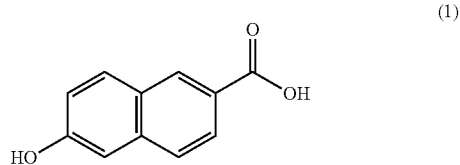

The composition ratio (mol %) of the structural unit (I) to the structural units of the entire liquid crystal polymer is preferably 40 mol % or more, more preferably 45 mol % or more, further preferably 50 mol % or more, further more preferably 55 mol % or more as a lower limit, and as an upper limit, preferably 80 mol % or less, more preferably 75 mol % or less, further preferably 70 mol % or less, further more preferably 65 mol % or less. When two or more of the structural unit (I) are contained, the total molar ratio thereof may be within the above ranges of the composition ratio.

Structural Unit (II) Derived from Diol Compound

Unit (II) constituting the liquid crystal polymer is a structural unit derived from a diol compound, and is preferably a structural unit derived from an aromatic diol compound represented by formula (II) below. Note that only one of the structural unit (II) may be contained or two or more may be contained.

In the above formula, $Ar^2$ is selected from the group consisting of a phenyl group having optionally a substituent, biphenyl group, 4,4'-isopropylidenediphenyl group, naphthyl group, anthryl group and phenanthryl group. Among these, a phenyl group and a biphenyl group are preferable. Examples of the substituent include hydrogen, alkyl group, alkoxy group, fluorine, and the like. The alkyl group preferably has 1 to 10 carbon atoms, more preferably 1 to 5 carbon atoms. The alkyl group may be a linear alkyl group or a branched alkyl group. The number of carbon atoms in the alkoxy group is preferably 1 to 10, more preferably 1 to 5.

Examples of the monomer that gives the structural unit (II) include 4,4-dihydroxybiphenyl (BP, formula (2) below), hydroquinone (HQ, formula (3) below), methyl hydroquinone (MeHQ, formula (4) below), 4,4'-isopropylidenediphenol (BisPA, formula (5) below), and acylated products, ester derivatives, acid halides thereof, and the like. Among these, it is preferable to use 4,4-dihydroxybiphenyl (BP) and acylated products, ester derivatives, and acid halides thereof.

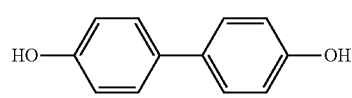

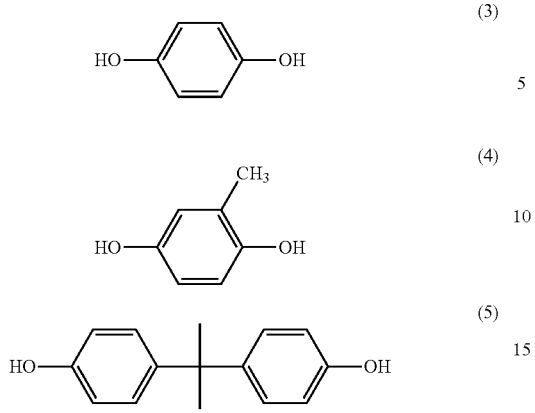

(3)

(4)

(5)

The composition ratio (mol %) of the structural unit (II) to the structural units of the entire liquid crystal polymer is preferably 10 mol % or more, more preferably 12.5 mol % or more, further preferably 15 mol % or more, further more preferably 17.5 mol % or more as a lower limit, and as an upper limit, preferably 30 mol % or less, more preferably 27.5 mol % or less, further preferably 25 mol % or less, further more preferably 22.5 mol % or less. When two or more of the structural unit (II) are contained, the total molar ratio thereof may be within the above ranges of the composition ratio.

Structural Unit (III) derived from Aromatic Dicarboxylic Acid

Unit (III) constituting the liquid crystal polymer is a structural unit derived from a dicarboxylic acid, and preferably a structural unit derived from an aromatic dicarboxylic acid represented by formula (III) below. It should be noted that only one of the structural unit (III) may be contained or two or more may be contained.

(III)

In the above formula, $Ar^3$ is selected from the group consisting of a phenyl group optionally having a substituent, biphenyl group, 4,4'-isopropylidenediphenyl group, naphthyl group, anthryl group and phenanthryl group. Among these, a phenyl group and a naphthyl group are preferable. Examples of the substituent include hydrogen, alkyl group, alkoxy group, fluorine, and the like. The alkyl group preferably has 1 to 10 carbon atoms, and more preferably 1 to 5 carbon atoms. In addition, the alkyl group may be a linear alkyl group or a branched alkyl group. The number of carbon atoms in the alkoxy group is preferably 1 to 10, more preferably 1 to 5.

Examples of the monomer that gives the structural unit (III) include terephthalic acid (TPA, formula (6) below), isophthalic acid (IPA, formula (7) below), 2,6-naphthalene dicarboxylic acid (NADA, formula (8) below), and acylated products, ester derivatives, acid halides thereof, and the like.

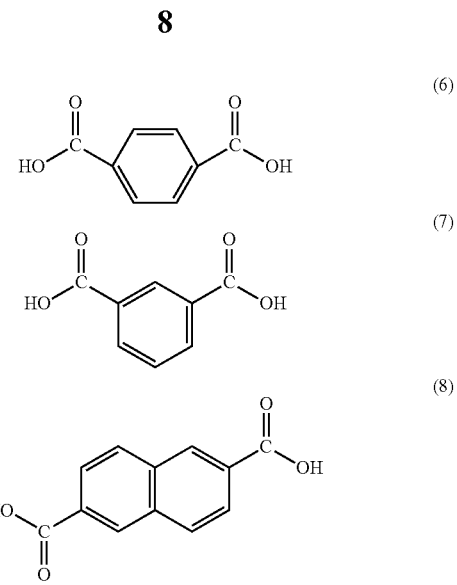

(6)

(7)

(8)

The composition ratio (mol %) of the structural unit (III) to the structural units of the entire liquid crystal polymer is preferably 10 mol % or more, more preferably 12.5 mol % or more, further preferably 15 mol % or more, further more preferably 17.5 mol % or more as a lower limit, and as an upper limit, preferably 30 mol % or less, more preferably 27.5 mol % or less, further preferably 25 mol % or less, further more preferably 22.5 mol % or less. When two or more of the structural unit (II) are contained, the total molar ratio thereof may be within the above ranges of the composition ratio. Note that the composition ratio of the structural unit (II) and the composition ratio of the structural unit (III) are substantially equivalent (structural unit (II) structural unit (III)).

Structural Unit (IV) Derived from Other Monomer

The liquid crystal polymer may further contain a structural unit other than the above-mentioned structural units (I) to (III). Structural unit (IV) is not particularly limited as long as it is derived from a monomer other than the monomer that gives the above-mentioned structural units (I) to (III) and is derived from a monomer having a polymerizable property that can be polymerized with the monomer that gives the above-mentioned structural units (I) to (III). Examples of the polymerizable group include a hydroxyl group, a carboxyl group, an amine group, and an amide group. The monomer for forming the structural unit (IV) has one or more, preferably two or more of these polymerizable groups. When two or more polymerizable groups are contained, those polymerizable groups may be the same or they may be different. Only one of the structural unit (IV) may be contained or two or more may be contained.

Example of the structural unit (IV) is the following structural unit (IV-1):

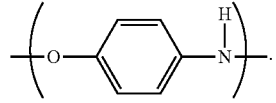

(IV-1)

Examples of the monomer that gives the structural unit (IV-1) include acetaminophenone (AAP, formula (9) below), p-aminophenol, 4'-acetoxyacetanilide, and acylated products, ester derivatives, and acid halides thereof, and the like.

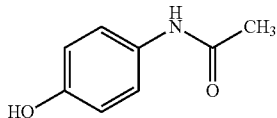

(9)

Example of the structural unit (IV) is the following structural unit (IV-2):

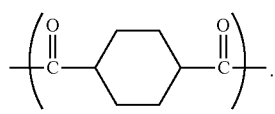

(IV-2)

Examples of the monomer which gives the structural unit (V-2) include 1,4-cyclohexane dicarboxylic acid (CHDA, formula (10) below) and acylated products, ester derivatives, and acid halides thereof, and the like.

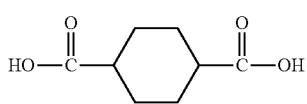

(10)

The composition ratio (mol %) of the structural unit (IV) to the structural units of the entire liquid crystal polymer can be appropriately set in accordance with the composition ratios of the structural units (I) to (III). Specifically, the composition ratio of each structural unit may be appropriately set in such a manner that the monomer ratio (molar ratio) of the carboxyl group to the hydroxyl group and/or the amine group in the monomer is in the range of 1:1.

Preferable composition of the liquid crystal polymer includes the followings.

45 mol % ≤6-hydroxy-2-naphthoic acid-derived structural unit (I) ≤75 mol %

12 mol % ≤aromatic diol compound-derived structural unit (II) ≤27.5 mol %

3 mol % ≤terephthalic acid-derived structural unit (IIIA) ≤25 mol %

2 mol % ≤2,6-naphthalenedicarboxylic acid-derived structural unit (IIIB) ≤9 mol %

Further, preferable composition of the liquid crystal polymer includes the following.

50 mol % ≤6-hydroxy-2-naphthoic acid-derived structural unit (I) ≤70 mol %

15 mol % ≤aromatic diol compound-derived structural unit (II) ≤25 mol %

9 mol % ≤terephthalic acid-derived structural unit (IIIA) ≤22 mol %

3 mol % ≤2,6-naphthalenedicarboxylic acid-derived structural unit (IIIB) ≤6 mol %

Further, more preferable composition of the liquid crystal polymer includes the following.

54 mol % ≤6-hydroxy-2-naphthoic acid-derived structural unit (I) ≤66 mol %

17 mol % ≤aromatic diol compound-derived structural unit (II) ≤23 mol %

11 mol % ≤terephthalic acid-derived structural unit (IIIA) ≤20 mol %

3 mol % ≤2,6-naphthalenedicarboxylic acid-derived structural unit (IIIB) ≤6 mol %

When each structural unit is within the above range with respect to the structural units of the entire liquid crystal polymer, it is possible to obtain liquid crystal polymer particles having low dielectric loss tangent.

Method for Producing Liquid Crystal Polymer

A liquid crystal polymer can be produced by polymerizing a monomer which gives structural units (I) to (III) optionally and a monomer which gives structural unit (IV) optionally by a method known in the art. In one embodiment, the liquid crystal polymer according to the present invention can also be produced by a two-step polymerization in which a prepolymer is produced by melt polymerization and further subjected to solid phase polymerization.

From the viewpoint of efficiently obtaining a liquid crystal polymer, melt polymerization is preferably carried out under reflux of acetic acid in the presence of acetic anhydride in an amount of 1.05 to 1.15 molar equivalents relative to the total hydroxyl groups of the monomer, based on the monomer giving the structural units (I) to (III) optionally and the monomer giving the structural unit (IV) optionally combined in a predetermined composition to the total of 100 mol %.

In the case where polymerization reaction is carried out by two steps of melt polymerization and subsequent solid phase polymerization, it is preferable to select a known solid phase polymerization method, for example, conducting heat treatment of the prepolymer resin in a temperature range of 200 to 350° C. for 1 to 30 hours under an inert atmosphere such as nitrogen or under vacuum after the prepolymer obtained by the melt polymerization is solidified by cooling and then pulverized into powder or flake form. The solid-phase polymerization may be carried out while stirring, or may be carried out in a still standing state without stirring.

A catalyst may be used or may not be used in the polymerization reaction. The catalyst to be used can be conventionally known catalysts as catalysts for polymerization of the liquid crystal polymer, examples thereof including metal salt catalysts such as magnesium acetate, stannous acetate, tetrabutyl titanate, lead acetate, sodium acetate, potassium acetate, and antimony trioxide, nitrogen-containing heterocyclic compounds such as N-methylimidazole, and organic compound catalysts. The amount of the catalyst used is not particularly limited, but is preferably 0.0001 to 0.1 parts by weight based on 100 parts by weight of the total amount of the monomer.

The polymerization apparatus in the melt polymerization is not particularly limited, but a reaction apparatus used for the reaction of a general high-viscosity fluid is preferably used. Examples of these reaction apparatuses include, for example, stirring vessel type polymerization reaction apparatus having a stirring apparatus with stirring blades of such as an anchor type, a multi-stage type, a spiral band type, a spiral shaft type, or various shapes obtained by deforming these types, or a mixing apparatus generally used for kneading a resin such as a kneader, a roll mill, a Banbury mixer, and the like.

Thermosetting Resin Composition

The thermosetting resin composition of the present invention comprises the above-mentioned liquid crystal polymer particles of the present invention and a thermosetting resin. Examples of the thermosetting resin include an epoxy resin, phenol resin, polyimide resin, cyanate resin, acrylic resin, maleimide resin, and bismaleimide triazine resin, with the polyimide resin being particularly preferred. Only one of the thermosetting resins may be contained, or two or more may be contained.

The content of the liquid crystal polymer particles in the thermosetting resin composition is preferably 5 to 80 parts by mass, more preferably 10 to 70 parts by mass, further preferably 15 to 60 parts by mass, and further more preferably 20 to 50 parts by mass with respect to 100 parts by mass of the thermosetting resin. When the content of the liquid crystal polymer particles is within the above ranges, the dielectric loss tangent can be reduced while suppressing the surface roughness of the resin film when the resin film is produced.

Method for Producing Thermosetting Resin Composition

The method for producing a thermosetting resin composition of the present invention includes at least a step of mixing the liquid crystal polymer particles and the thermosetting resin at a temperature lower than the melting point of the liquid crystal polymer particles. By mixing at a temperature lower than the melting point of the liquid crystal polymer particles, the thermosetting resin composition can be obtained without changing the particle size distribution of the liquid crystal polymer particles as much as possible. The mixing method can be carried out by a method known in the art. For example, mixing can be carried out by using a Banbury mixer, a kneader, a single- or twin-screw extruder, and the like.

Molded Article

The molded article of the present invention can be obtained by using the above-described thermosetting resin composition. The molded article according to the present invention may contain components other than the above-described liquid crystal polymer particles and the thermosetting resin to the extent that the effect of the present invention is not impaired. Examples of the other components include, for example, colorants, dispersants, plasticizers, antioxidants, curing agents, flame retardants, thermal stabilizers, ultraviolet absorbers, antistatic agents, surfactants, and the like.

The thickness of the molded article is not particularly limited, and is usually 10 μm to 200 μm, preferably 150 μm or less, more preferably 100 μm or less, and further preferably 80 μm or less. The molded article using the thermosetting resin composition containing the liquid crystal polymer particles of the present invention can suppress surface roughness even in a thin film having a thickness of 200 μm or less.

Resin Film

The resin film of the present invention can reduce the dielectric loss tangent while suppressing the surface roughness of the resin film by using the liquid crystal polymer particles described above. The surface roughness Ra of the resin film is preferably 1.0 μm or less, more preferably 0.9 μm or less, and further preferably 0.8 μm or less.

The thickness of the resin film is preferably 25 μm or less, more preferably 20 μm or less, and may be 10 μm or more.

The surface roughness Ra can be suppressed by using the liquid crystal polymer particles even when such a thin film is produced.

Method for Producing Molded Article

In the present invention, the above-mentioned thermosetting resin composition can be obtained by molding with a conventionally known method. Examples of the molding method include press molding, foam molding, injection molding, extrusion molding, punching molding, and the like. The molded article produced as described above can be processed into various shapes according to the purpose. The shape of the molded article is, for example, a film form, a sheet form, or a plate form, without particular limitation. In particular, since the surface roughness of the molded article can be reduced by using the liquid crystal polymer particles of the present invention even in the case of a thin film, they are suitable for a film form molded article.

Electronic Circuit Board

The electronic circuit board of the present invention can be obtained by using the thermosetting resin composition described above. The electronic circuit board of the present invention encompasses the molded article described above. The electronic circuit board is preferably a flexible circuit board because dielectric loss tangent can be reduced while suppressing the surface roughness even if it is formed into a thin film Other Configurations The liquid crystal polymer particles of the present invention can be used not only as a molded article for the above-described film and electronic circuit board but also as a bonding sheet, a prepreg, a cover ray, and the like. Also, the liquid crystal polymer particles of the present invention are not limited to molded articles, and can be used as a paste composition, for example, in which case they can be used as an adhesive, an interlayer insulating material, a sealing material, and the like.

EXAMPLES

Hereinafter, the present invention shall be described more specifically with reference to the Examples, but the present invention shall not be limited to the Examples.

Synthesis of Liquid Crystal Polymer

Synthesis Example 1

60 mol % of 6-hydroxy-2-naphthoic acid (HNA), 20 mol % of 4,4-dihydroxybiphenyl (BP), 15.5 mol % of terephthalic acid (TPA), and 4.5 mol % of 2,6-naphthalenedicarboxylic acid (NADA), and potassium acetate and magnesium acetate as catalysts were fed to a polymerization vessel having stirring blades, then the polymerization vessel was subjected to pressure reduction-nitrogen injection three times to substitute the nitrogen, and subsequently acetic anhydride (1.08 molar equivalent to the hydroxyl group) was further added, the temperature was raised to 150° C., and acetylation reaction was carried out under reflux for 2 hours.

After completion of acetylation, the polymerization vessel in an acetic acid-distilled state was heated at 0.5° C./min, the polymer was drawn out when the melt temperature in the vessel reached 310° C., and the polymer was solidified by cooling. The polymer thus obtained was pulverized to a size that passed through a sieve having a mesh opening of 2.0 mm to obtain a prepolymer.

Next, the prepolymer obtained as described above was heated over 14 hours from room temperature to 295° C. by using a heater in an oven manufactured by Yamato Kagaku Co., Ltd., and then solid phase polymerization was performed while maintaining the temperature at 295° C. for 1 hour. Then, the heat in the prepolymer was naturally released at room temperature to obtain Liquid crystal polymer A. By using a polarizing microscope (product name: BH-2) manufactured by Olympus Co., Ltd. equipped with a microscope hot stage (product name: FP82HT) manufactured by Mettler, it was confirmed that liquid crystallinity was exhibited by heating and melting the Liquid crystal polymer A on a microscope heating stage and confirming from the presence or absence of optical anisotropy.

Synthesis Example 2

Liquid crystal polymer B was obtained in the same manner as in Synthesis Example 1, except that the monomer feed was changed to 60 mol % of p-hydroxybenzoic acid (HBA), 20 mol % of BP, 15 mol % of TPA, and 5 mol % of IPA, and the final temperature of solid phase polymerization was set at 265° C. and the retention time was set at 1 hour. Subsequently, it was confirmed in the same manner as described above that the obtained Liquid crystal polymer B exhibited liquid crystallinity.

Production of Liquid Crystal Polymer Particles

Example 1

Powder (average diametre: 80 μm) of the Liquid crystal polymer A synthesized above was pulverized for 15 minutes using a Nano Jetmizer NJ-50 type jet mill manufactured by Aishin Nanotechnologies Co., Ltd. under conditions of a pulverization pressure of 1.4 MPa and a resin feed rate of 120 g/h to obtain a pulverized product. Using a vibration sieving machine equipped with an ultrasonic oscillator, the pulverized product thus obtained was passed through a sieve having a mesh opening of 20 μm and those which passed the sieve was collected. As a result, substantially spherical liquid crystal polymer particles A1 were obtained.

Example 2

Regarding 2 minutes of pulverization time and 1 minute of cooling time using a freezer mill type 6775 manufactured by SPEX Co., Ltd. as one cycle, powder of the liquid crystal polymer A was subjected to the cycle for ten times, thereby obtaining a pulverized product. The obtained pulverized product was passed through a sieve having a mesh opening of 20 μm using a vibration sieving machine equipped with an ultrasonic oscillator, and the pulverized object which passed through the sieve was collected. As a result, substantially spherical liquid crystal polymer particles A2 were obtained.

Example 3

Pulverization was performed three times under the same pulverization apparatus and pulverization conditions as in Example 1 to obtain a pulverized product. The obtained pulverized product was passed through a sieve having a mesh opening of 20 μm using a vibration sieving machine equipped with an ultrasonic oscillator, and the pulverized object which passed through the sieve was collected. As a result, substantially spherical liquid crystal polymer particles A3 were obtained.

Example 4

Powder of the liquid crystal polymer A was continuously pulverized under conditions of a pulverizing pressure of 0.65 MPa and a resin supply amount of 5 kg/h using an apparatus in which a DSF-10 type classifier manufactured by Nippon Pneumatic Mfg. Co., Ltd. was combined with a SPK-12 type jet mill manufactured by Nippon Pneumatic Mfg. Co., Ltd., to obtain a substantially spherical liquid crystal polymer A4.

Comparative Example 1

Substantially spherical liquid crystal polymer particles A5 were obtained in the same manner as in Example 1, except that the sieve having a mesh opening of 20 μm was not used.

Comparative Example 2

Substantially spherical liquid crystal polymer particles B1 were obtained in the same manner as in Example 1, except that Liquid crystal polymer B was used instead of Liquid crystal polymer A and the sieve having an opening of 20 μm was not used.

Evaluation of Liquid Crystal Polymer

Measurement of Particle Size Distribution

Particle size distribution of the liquid crystal polymer particles obtained as described above was measured by a laser diffraction/scattering method particle size distribution measuring device (manufactured by Beckman Coulter, LS13 320 dry system, equipped with tornado dry powder module). The parameters $D_{50}$, $D_{90}$ and $D_p$ indicating the particle size distribution were obtained as calculation results from the measurement data. The results are shown in Table 1.

Measurement of Melting Point

Melting point of each liquid crystal polymer obtained above was measured by a differential scanning calorimeter (DSC) manufactured by Hitachi High-Tech Science Co., Ltd. in accordance with the test method of ISO11357 and ASTM D3418. At this time, the temperature was raised from room temperature to 360 to 380° C. at a heating rate of 10° C./min to completely melt the polymer, then the melting point ($Tm_2$) was determined from the peak of the endothermic peak obtained when the temperature was lowered to 30° C. at a rate of 10° C./min, and further raised to 380° C. at a rate of 10° C./min. The measurement results are shown in Table 1.

Measurement of Dielectric Loss Tangent (10 GHz)

Flat test pieces were obtained using each liquid crystal polymer obtained above by heating and melting under conditions of individual melting point to melting point +30° C., and then injection-molding using a mold of 30 mm×30 mm×0.4 mm (thickness). Subsequently, using the flat test pieces, dielectric loss tangent at a frequency of 10 GHz was measured by a split post dielectric resonator method (SPDR method) using a network analyzer N5247A of Keysight Technologies. Samples of each type were measured every N=4, and the average values of 4 measurements are shown in Table 1.

Measurement of Water Absorption Rate

Water absorption rate of each of the liquid crystal polymer particles produced above was measured by the following procedure. Approximately 0.1 g of liquid crystal polymer particles were cut out, dried in a vacuum oven set at 100° C. for 1 hour, then precisely weighed, and the dry weight was measured. After the liquid crystal polymer particles were immersed in pure water for 24 hours, the moisture adhered was wiped off with Kimwipes, precisely weighed, and the weight at the time of water absorption was measured. The difference between the weight at water absorption and the weight at the time of drying was divided by the weight at the time of drying to calculate the water absorption rate. The calculation results are shown in Table 1.

of Liquid crystal polymer particles A2 were added instead of Liquid crystal polymer particles A1.

Example 9

A film having a thickness of 20 μm was produced in the same manner as in Example 6, except that 30 parts by mass of Liquid crystal polymer particles A3 were added instead of Liquid crystal polymer particles A1.

Reference Example

A film having a thickness of 60 μm was produced in the same manner as in Example 5, except that Liquid crystal polymer particles A1 were not added.

Comparative Example 3

A film having a thickness of 20 μm was produced in the same manner as in Example 6, except that 30 parts by mass of Liquid crystal polymer particles A4 were added instead of Liquid crystal polymer particles A1.

TABLE 1

| Liquid Crystal Polymer Particles | Composition (mol %) | | | | | | Particle Size Distribution | | | Melting Point (° C.) | Dielectric Tangent tanδ | Water Absorption Rate (%) |
|---|---|---|---|---|---|---|---|---|---|---|---|---|
| | Constituting Unit (I) | | Constituting Unit (II) | Constituting Unit (III) | | | $D_{50}$ (μm) | $D_{90}/D_{50}$ (μm) | $D_p/D_{50}$ | | | |
| | HNA | HBA | BP | TPA | NADA | IPA | | | | | | |
| Ex. 1 | A1 | 60 | — | 20 | 15.5 | 4.5 | — | 9.0 | 1.6 | 1.1 | 319 | 0.0007 | Less than 0.02 |
| Ex. 2 | A2 | 60 | — | 20 | 15.5 | 4.5 | — | 10.5 | 1.7 | 1.2 | 319 | 0.0007 | Less than 0.02 |
| Ex. 3 | A3 | 60 | — | 20 | 15.5 | 4.5 | — | 7.5 | 1.8 | 1.2 | 319 | 0.0007 | Less than 0.02 |
| Ex. 4 | A4 | 60 | — | 20 | 15.5 | 4.5 | — | 5.3 | 1.7 | 1.0 | 319 | 0.0007 | Less than 0.02 |
| Comp. Ex. 1 | A5 | 60 | — | 20 | 15.5 | 4.5 | — | 12.5 | 2.6 | 0.7 | 319 | 0.0007 | Less than 0.02 |
| Comp. Ex. 2 | B1 | — | 60 | 20 | 15 | — | 5 | 8.3 | 4.3 | 0.9 | 355 | 0.004 | Less than 0.02 |

Film Production 1

Example 5

To a polyimide varnish (SPIXAREA GR003, manufactured by SOMAR CORPORATION) was added 30 parts by weight of Liquid crystal polymer particles A1 based on 100 parts by weight of the polyimide in the varnish to obtain a suspension. The resulting suspension was applied to a glass substrate, dried and cured to produce a film having a thickness of 60 μm.

Example 6

A film was produced in the same manner as in Example 5, except that the thickness of the film was changed to other than 20 μm.

Example 7

A film having a thickness of 20 μm was produced in the same manner as in Example 6, except that the amount of Liquid crystal polymer particles A1 added was changed from 30 parts by mass to 50 parts by mass.

Example 8

A film having a thickness of 20 μm was produced in the same manner as in Example 6, except that 30 parts by mass Comparative Example 4

A film having a thickness of 20 μm was produced in the same manner as in Example 6, except that 30 parts by mass of Liquid crystal polymer particles B1 were added instead of Liquid crystal polymer particles A1.

Performance Evaluation

Measurement of Surface Roughness

Each of the films produced above was cut out into 3 mm×80 mm strips to obtain film samples. Subsequently, surface roughness of the film sample was measured using an OLS5000 type laser microscope manufactured by Olympus Co., Ltd. The measurement results are shown in Table 2.

Measurement of Dielectric Constant and Dielectric Loss Tangent

Each of the film samples produced above were measured for the dielectric constant and dielectric loss tangent at 10 GHz were using a measuring device in which a cavity resonator manufactured by AET, Inc. is connected to spectrum network analyzer MS46122B type manufactured by Anritsu Corporation. The measurement results are shown in Table 2.

Measurement of Water Absorption Rate

The water absorption rate of each film produced above was measured by the following procedure. Approximately 0.1 g of the film was cut out, dried in a vacuum oven set at 100° C. for 1 hour, then precisely weighed, and the dry weight was measured. After the film was immersed in pure water for 24 hours, the moisture adhered was wiped off with Kimwipes, precisely weighed, and the weight at the time of water absorption was measured. The difference between the weight at water absorption and the weight at the time of drying was divided by the weight at the time of drying to calculate the water absorption rate. The calculation results are shown in Table 2.

TABLE 2

|  | Liquid Crystal Polymer Particles | Addition Amount (%) | Film thickness (μm) | Surface Roughness Ra (μm) | Dielectric Tangent tanδ | Dielectric Constant | Water Absorption Rate (%) |
|---|---|---|---|---|---|---|---|
| Ex.5 | A1 | 30 | 60 | 0.28 | 0.014 | 3.06 | 1.5 |
| Ex.6 | A1 | 30 | 20 | 0.63 | 0.014 | 3.05 | 1.4 |
| Ex.7 | A1 | 50 | 20 | 0.96 | 0.010 | 3.05 | 1.1 |
| Ex.8 | A2 | 30 | 20 | 0.80 | 0.014 | 3.05 | 1.4 |
| Ex.9 | A3 | 30 | 20 | 0.53 | 0.014 | 3.05 | 1.4 |
| Ref. Ex. | — | — | 60 | 0.08 | 0.020 | 2.93 | 1.9 |
| Comp. Ex.3 | A5 | 30 | 20 | 2.43 | 0.014 | 3.05 | 1.4 |
| Comp. Ex.4 | B1 | 30 | 60 | 3.01 | 0.016 | 3.21 | 1.4 |

Production of Film 2

Example 10

To a glass container equipped with a stirrer were added 60% m-toluidine (tol), 40% 4,4'-diaminodiphenyl ether (DDE) and N,N-dimethylacetamide so that a predetermined concentration is obtained, and the mixture was stirred at 25° C. under a nitrogen atmosphere to obtain a solution. 100% of pyromellitic dianhydride (PMDA) was added to this solution in several batches and stirred at 25° C. under a nitrogen atmosphere to obtain a polyamic acid varnish. To the polyamic acid varnish thus obtained was added 30 parts by mass of Liquid crystal polymer particles A4 based on 100 parts by mass of polyamic acid in the varnish to obtain a suspension. The suspension thus obtained was applied to a glass substrate, dried and then cured at 300° C. to produce a film having a thickness of 25 μm.

Example 11

A film having a thickness of 25 μm was produced in the same manner as in Example 10, except that the addition amount of Liquid crystal polymer particles A4 was 50 parts by mass with respect to 100 parts by mass of the polyamic acid.

Example 12

A film having a thickness of 25 μm was produced in the same manner as in Example 11, except that the temperature at which the suspension applied on the glass substrate was dried and then cured was set to 350° C.

(Reference Example 2)

A film having a thickness of 25 μm was produced in the same manner as in Example 10, except that Liquid crystal polymer particles A4 were not added.

Performance Evaluation

Performance evaluation was performed in the same manner as in Film Production 1 described above. The evaluation results are shown in Table 3.

TABLE 3

|  | Liquid Crystal Polymer Particles | Addition amount (%) | Baking temperature (° C.) | Film thickness (μm) | Surface Roughness Ra (μm) | Dielectric loss tangent tanδ | Dielectric constant |
|---|---|---|---|---|---|---|---|
| Ex. 10 | A4 | 30 | 300 | 25 | 0.23 | 0.0017 | 3.26 |
| Ex. 11 | A4 | 50 | 300 | 25 | 0.26 | 0.0016 | 3.30 |
| Ex. 12 | A4 | 50 | 350 | 25 | 0.45 | 0.0015 | 2.93 |

Generally, when the powder of liquid crystal polymer particles is mixed with polyamic acid which is a precursor of polyimide, burning conditions are appropriately adjusted to 300° C. or higher in order to sufficiently increase the imidization rate of polyimide. According to the above results, use of the liquid crystal polymer of the present invention makes it possible to suppress adverse effects on the dielectric loss tangent, relative dielectric constant, and surface roughness of the film as much as possible even when the burning conditions are adjusted in that manner.

The invention claimed is:

1. Liquid crystal polymer particles having a melting point of 270° C. or higher, wherein cumulative distribution 50% diametre $D_{50}$ in the particle size distribution is 20 μm or less, and cumulative distribution 90% diametre $D_{90}$ is 2.5 times or less of $D_{50}$, and the ratio of modal diametre $D_p$ to $D_{50}$ in the particle size distribution is 0.7 or more and 1.3 or less, wherein $D_p$ is the value of the particle size at the highest frequency.

2. The liquid crystal polymer particles according to claim 1, wherein dielectric loss tangent of the liquid crystal polymer particles is 0.001 or less.

3. A thermosetting resin composition comprising the liquid crystal polymer particles according to claim 2 and a thermosetting resin.

4. The liquid crystal polymer particles according to claim 1, having a water absorption rate of 0.05% or less.

5. A thermosetting resin composition comprising the liquid crystal polymer particles according to claim 4 and a thermosetting resin.

6. The liquid crystal polymer particles according to claim 1, comprising structural unit (I) derived from a hydroxycarboxylic acid, structural unit (II) derived from a diol compound, and structural unit (III) derived from a dicarboxylic acid.

7. The liquid crystal polymer particles according to claim 6, wherein the structural unit (I) derived from a hydroxycarboxylic acid is a structural unit derived from 6-hydroxy-2-naphthoic acid.

8. A thermosetting resin composition comprising the liquid crystal polymer particles according to claim 7 and a thermosetting resin.

9. The liquid crystal polymer particles according to claim 6, wherein the composition ratio of the structural unit (I) is 40 mol % or more and 80 mol % or less with respect to the structural units of the entire liquid crystal polymer particles.

10. A thermosetting resin composition comprising the liquid crystal polymer particles according to claim 6 and a thermosetting resin.

11. A thermosetting resin composition comprising the liquid crystal polymer particles according to claim 1 and a thermosetting resin.

12. The thermosetting resin composition according to claim 11, wherein the content of the liquid crystal polymer particles is 5 to 80% by mass with respect to 100 parts by mass of the thermosetting resin.

13. The thermosetting resin composition according to claim 11, wherein the thermosetting resin is at least one selected from the group consisting of an epoxy resin, phenol resin, polyimide resin, and bismaleimide triazine resin.

14. A method for producing the thermosetting resin composition according to claim 11, comprising the step of mixing at least the liquid crystal polymer particles and the thermosetting resin at a temperature lower than the melting point of the liquid crystal polymer particles.

15. A molded article using the thermosetting resin composition according to claim 11.

16. The molded article according to claim 15 in the form of a film, a sheet or a plate.

17. The molded article according to claim 16, being a resin film having a thickness of 25 μm or less.

18. The molded article according to claim 17, wherein surface roughness Ra of the resin film is 1.0 μm or less.

19. An electronic circuit board comprising the thermosetting resin composition according to claim 11.

20. The electronic circuit board according to claim 19, being a flexible circuit board.

* * * * *